(12) United States Patent
Kim

(10) Patent No.: US 7,894,230 B2
(45) Date of Patent: Feb. 22, 2011

(54) STACKED SEMICONDUCTOR DEVICES INCLUDING A MASTER DEVICE

(75) Inventor: Jin-Ki Kim, Kanata (CA)

(73) Assignee: MOSAID Technologies Incorporated, Ottawa (CA)

( * ) Notice: Subject to any disclaimer, the term of this patent is extended or adjusted under 35 U.S.C. 154(b) by 60 days.

(21) Appl. No.: 12/429,310

(22) Filed: Apr. 24, 2009

(65) Prior Publication Data

US 2010/0214812 A1 Aug. 26, 2010

Related U.S. Application Data

(60) Provisional application No. 61/154,910, filed on Feb. 24, 2009.

(51) Int. Cl.
*G11C 5/02* (2006.01)

(52) U.S. Cl. .................... 365/51; 365/63; 365/164; 365/185.11

(58) Field of Classification Search .............. 365/164
See application file for complete search history.

(56) References Cited

U.S. PATENT DOCUMENTS

| | | | |
|---|---|---|---|
| 5,399,898 A | 3/1995 | Rostoker | |
| 5,579,207 A | 11/1996 | Hayden et al. | |
| 5,818,107 A | 10/1998 | Pierson et al. | |
| 6,198,649 B1 * | 3/2001 | Matsudera et al. | 365/63 |
| 6,327,168 B1 * | 12/2001 | Campbell | 365/51 |
| 6,376,904 B1 | 4/2002 | Haba et al. | |
| 6,410,431 B2 | 6/2002 | Bertin et al. | |
| 6,555,917 B1 | 4/2003 | Heo | |
| 6,566,746 B2 | 5/2003 | Isaak et al. | |
| 6,577,013 B1 | 6/2003 | Glenn et al. | |
| 6,621,169 B2 | 9/2003 | Kikuma et al. | |
| 6,841,883 B1 | 1/2005 | Farnworth et al. | |
| 6,900,528 B2 | 5/2005 | Mess et al. | |
| 6,908,785 B2 * | 6/2005 | Kim | 438/106 |
| 6,982,487 B2 | 1/2006 | Kim et al. | |
| 7,102,905 B2 | 9/2006 | Funaba et al. | |
| 7,115,972 B2 | 10/2006 | Dotta et al. | |
| 7,132,752 B2 | 11/2006 | Saeki | |
| 7,163,842 B2 | 1/2007 | Karnezos | |
| 7,170,157 B2 | 1/2007 | Lee | |
| 7,193,310 B2 | 3/2007 | Roeters et al. | |
| 7,215,033 B2 * | 5/2007 | Lee et al. | 257/777 |
| 7,217,995 B2 | 5/2007 | Tsai et al. | |
| 7,241,641 B2 | 7/2007 | Savastiouk et al. | |
| 7,262,506 B2 | 8/2007 | Mess et al. | |
| 7,268,418 B2 | 9/2007 | Wang | |

(Continued)

FOREIGN PATENT DOCUMENTS

WO 2009102821 8/2009

OTHER PUBLICATIONS

Imamiya, et al., "A 125-mm2 1-Gb NAND Flash Memory With 10-MByte/s Program Speed," IEEE J Solid-State Circuits, vol. 37, No. 11, pp. 1493-1500, Nov. 2002.

(Continued)

*Primary Examiner*—Tan T. Nguyen
(74) *Attorney, Agent, or Firm*—Daniel Hammond

(57) ABSTRACT

A stack that includes non-volatile memory devices is disclosed. One of the non-volatile memory devices in the stack is a master device, and the remaining memory device or devices is a slave device(s).

26 Claims, 11 Drawing Sheets

U.S. PATENT DOCUMENTS

| | | | |
|---|---|---|---|
| 7,276,799 | B2 | 10/2007 | Lee et al. |
| 7,282,791 | B2 | 10/2007 | Funaba et al. |
| 7,291,924 | B2 | 11/2007 | Wang et al. |
| 7,298,032 | B2 | 11/2007 | Kim et al. |
| 7,317,256 | B2 | 1/2008 | Williams et al. |
| 7,379,316 | B2 * | 5/2008 | Rajan .......................... 365/63 |
| 7,466,577 | B2 * | 12/2008 | Sekiguchi et al. ............. 365/51 |
| 7,545,663 | B2 * | 6/2009 | Ikeda et al. .................... 365/63 |
| 7,623,365 | B2 * | 11/2009 | Jeddeloh ....................... 365/63 |
| 7,764,564 | B2 * | 7/2010 | Saito et al. ............. 365/230.03 |
| 2002/0158325 | A1 | 10/2002 | Yano et al. |
| 2002/0180025 | A1 | 12/2002 | Miyata et al. |
| 2004/0229401 | A1 | 11/2004 | Bolken et al. |
| 2006/0091518 | A1 | 5/2006 | Grafe et al. |
| 2006/0097374 | A1 | 5/2006 | Egawa |
| 2006/0197211 | A1 | 9/2006 | Miyata et al. |
| 2007/0045827 | A1 | 3/2007 | Han et al. |
| 2007/0165457 | A1 | 7/2007 | Kim |
| 2007/0257340 | A1 | 11/2007 | Briggs et al. |
| 2008/0080261 | A1 | 4/2008 | Shaeffer et al. |
| 2009/0040861 | A1 | 2/2009 | Ruckerbauer |
| 2010/0074038 | A1 * | 3/2010 | Ruckerbauer et al. ....... 365/200 |

OTHER PUBLICATIONS

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Session 7, Feb. 6-9, 2006, pp. 507-516, ISBN: 1-4244-0079-1.

Samsung Electronics Co. Ltd, "2G×8 Bit NAND Flash Memory", K9GAG08U0M, Apr. 12, 2006, pp. 1-48.

Toshiba, "16 GBIT (2G×8 Bit) CMOS NAND E2PROM (Multi-Level-Cell)", TC58NVG4D1DTG00, Nov. 9, 2006, pp. 1-64.

Choi, Young, "16-Gbit MLC NAND Flash Weighs In", EETimes.com, Jul. 30, 2007, pp. 1-3, http://www.eetimes.com/showArticle.jhtml?articleID=201200825.

Zeng, et al., "A 172mm2 32Gb MLC NAND Flash Memory in 34nm CMOS," ISSCC Dig. Tech. Paper, pp. 236-237, Feb. 2009.

Burns, et al., "Three-Dimensional Integrated Circuits for Low Power, High-Bandwidth System on a Chip," ISSCC Dig. Tech. Paper, pp. 268-269, Feb. 2001.

Karnezos M., 3D Packaging Tutorial 12th Annual KGD Packaging & Test Workshop, Sep. 11-14, 2005, Napa, CA, USA.

Siblerud P. & Kim B., Cost Effective TSV Chip Integration, EMC-3D Semiconductor 3-D Equipment and Materials Consortium, EMC-3D SE Asia Technical Symposium, Jan. 22-26, 2007.

* cited by examiner

US 7,894,230 B2

STACKED SEMICONDUCTOR DEVICES INCLUDING A MASTER DEVICE

CROSS REFERENCE TO RELATED APPLICATIONS

This application claims the benefit of priority of U.S. Provisional Patent Application Ser. No. 61/154,910 filed Feb. 24, 2009, which is incorporated herein by reference in its entirety.

BACKGROUND OF THE DISCLOSURE

Today, many electronic devices include memory systems to store information. Some memory systems store, for example, digitized audio or video information for playback by a respective media player. Other memory systems store, for example, software and related information to carry out different types of processing functions. Also, some types of memory systems such as, for example, Dynamic Random Access Memory (DRAM) systems and Static Random Access Memory (SRAM) systems are volatile memory systems in that stored data is not preserved when the power is off, whereas other types of memory systems such as, for example, NAND flash memory systems and NOR flash memory systems are nonvolatile memory systems in that stored data is preserved when the power is off.

As time progresses, consumers have an expectation that memory systems will have increasingly larger capacities provided by chips of increasing smaller size. Historically an important factor in the ability to do this has been the scaling down of process technology; however it is quite possible that in the near future the costs and limits of this approach could become increasingly more ominous. For example, as process technology is scaled down below 50 nm, it becomes extremely challenging to develop memory devices in smaller geometry, especially flash memories due to worsening transistor characteristics and reliability such as retention and endurance. Also, the scaling down of process technology is a huge investment. Thus, in view of the above costs and limits of the scaling down of process technology, there is a need to research and develop new ways to realize memory systems of increasingly larger capacities.

SUMMARY

It is an object of the invention to provide improved semiconductor devices that are adapted to be stacked.

According to one aspect of the invention, there is provided a system that includes a stack. The stack includes a first non-volatile memory chip and a second non-volatile memory chip. The second non-volatile memory chip is lacking in at least some non-core circuitries so that chip size reduction is facilitated. A plurality of electrical paths extend between the first non-volatile memory chip and the second non-volatile memory chip. The electrical paths facilitate the first non-volatile memory chip in providing the second non-volatile memory chip with signals and voltages needed for device operations.

According to another aspect of the invention, there is provided a method that includes manufacturing first and second non-volatile memory chips that are compatible with each other. The first and second non-volatile memory chips are manufactured having substantially similar core chip areas, but with only the first non-volatile memory chip having additional chip areas within which are located circuitries providing functionality for the shared of benefit of both the first and second non-volatile memory chips. The circuitries of the additional chip areas are configured to generate signals and voltages needed for device operations in relation to both the first and second non-volatile memory chips.

According to yet another aspect of the invention, there is provided a method that includes stacking at least two semiconductor chips. One of the semiconductor chips is a master memory device and another of the semiconductor chips is a slave memory device. The method also includes wiring the stacked semiconductor chips together by Through-Silicon Vias, and connecting the stacked semiconductor chips to a package printed circuit board by flip chip and bumping.

According to yet another aspect of the invention, there is provided a non-volatile memory chip that includes core chip areas that take up most (for example, greater than eighty percent, or even greater than ninety percent) of an entire chip area of the non-volatile memory chip. Within an additional chip area of the non-volatile memory chip there are located circuitries configured to receive signals and voltages from another non-volatile memory chip. The core chip areas having a more miniaturized process technology as compared to the additional chip area.

Thus, an improved system that includes one or more memory devices has been provided.

BRIEF DESCRIPTION OF THE DRAWINGS

Reference will now be made, by way of example, to the accompanying drawings.

Figure 1:
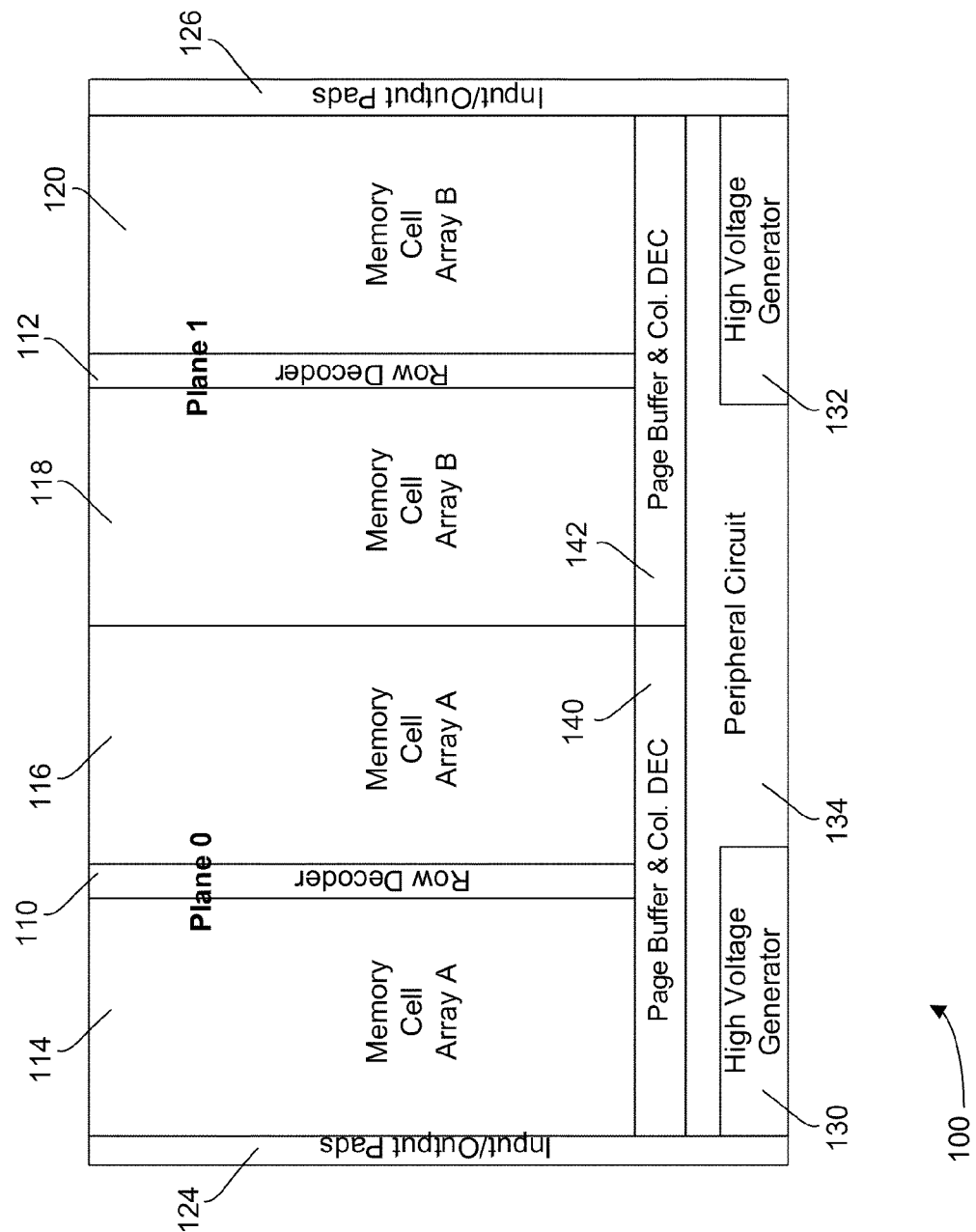
FIG. 1 is a block diagram of an example NAND flash chip floor plan.

Similar or the same reference numerals may have been used in different figures to denote similar example features illustrated in the drawings. Also, various example embodiments have not been shown to scale in the drawings. For example, the dimensions of certain illustrated elements or components may have been exaggerated for convenience of illustration.

DETAILED DESCRIPTION OF EXAMPLE EMBODIMENTS

Although the term "area" may in other contexts be understood to mean a two-dimensionally defined space, it will be understood that a three-dimensionally defined space (zone) is consistent with the term "area" as is it used herein.

FIG. 1 is a block diagram of an example NAND flash chip floor plan 100 illustrating one possible dividing of the placement of major components within the chip area of a flash memory device. In the floor plan 100, two row decoder areas 110 and 112 extend between adjacent memory cell array areas 114 and 116, and 118 and 120 respectively. With respect to row decoder areas 110 and 112, it is within these areas that the row decoders of the flash memory device can be found. As will be understood by those skilled in the art, a row decoder is a component of a memory device that selects a page for either a read or program operation. By contrast, for a conventional erase operation, a block rather than a page is selected by the row decoder. With respect to memory cell array areas 114, 116, 118 and 120, it is within these areas that the memory cell arrays of the flash memory device can be found. As will be understood by those skilled in the art, the memory cell array of a flash memory device comprises many (for example, millions) of flash memory cells, each within which one or more bits (logic '1's or '0's) may be stored.

Extending along width-wise edges of the floor plan 100 are input/output pad areas 124 and 126, and extending along length-wise edges of the floor plan 100 are high voltage generator areas 130 and 132, and peripheral circuit area 134. With respect to input/output pad areas 124 and 126, it is within these areas that the input/output pads of the flash memory device can be found. As will be well understood by those skilled in the art, various signals travel through these pads, into or out from the memory chip. Also, in accordance with at least one alternative example, it is contemplated that an input/output pad area similar to the illustrated areas may extend along the length-wise edge (of a floor plan) nearest the peripheral circuit area.

With respect to high voltage generator areas 130 and 132, it is within these areas that one finds the high voltage generators of the flash memory device such as, for example, charge pumps. In some examples, a "high voltage" means a voltage higher than an operating voltage (for instance, a voltage higher than Vcc). Also the high voltage generators, in some examples, collectively generate a range of higher voltages.

With respect to peripheral circuit area 134, it is within this area that other circuitry important for device operation such as, for example, the following:

Input and output buffers for address and data
Input buffers for control and command signals
State machine including command decoder
Address counter
Row and column pre-decoder
Status register Also, adjacent the peripheral circuit area 134 is additional circuit areas 140 and 142. It is within these areas that the page buffers and column decoders of the flash memory device can be found. Page buffers and column decoders are components of a flash memory device having functions well known to those skilled in the art. For example, input data is sequentially loaded into a page buffer via a column decoder during flash memory programming.

Figure 2:
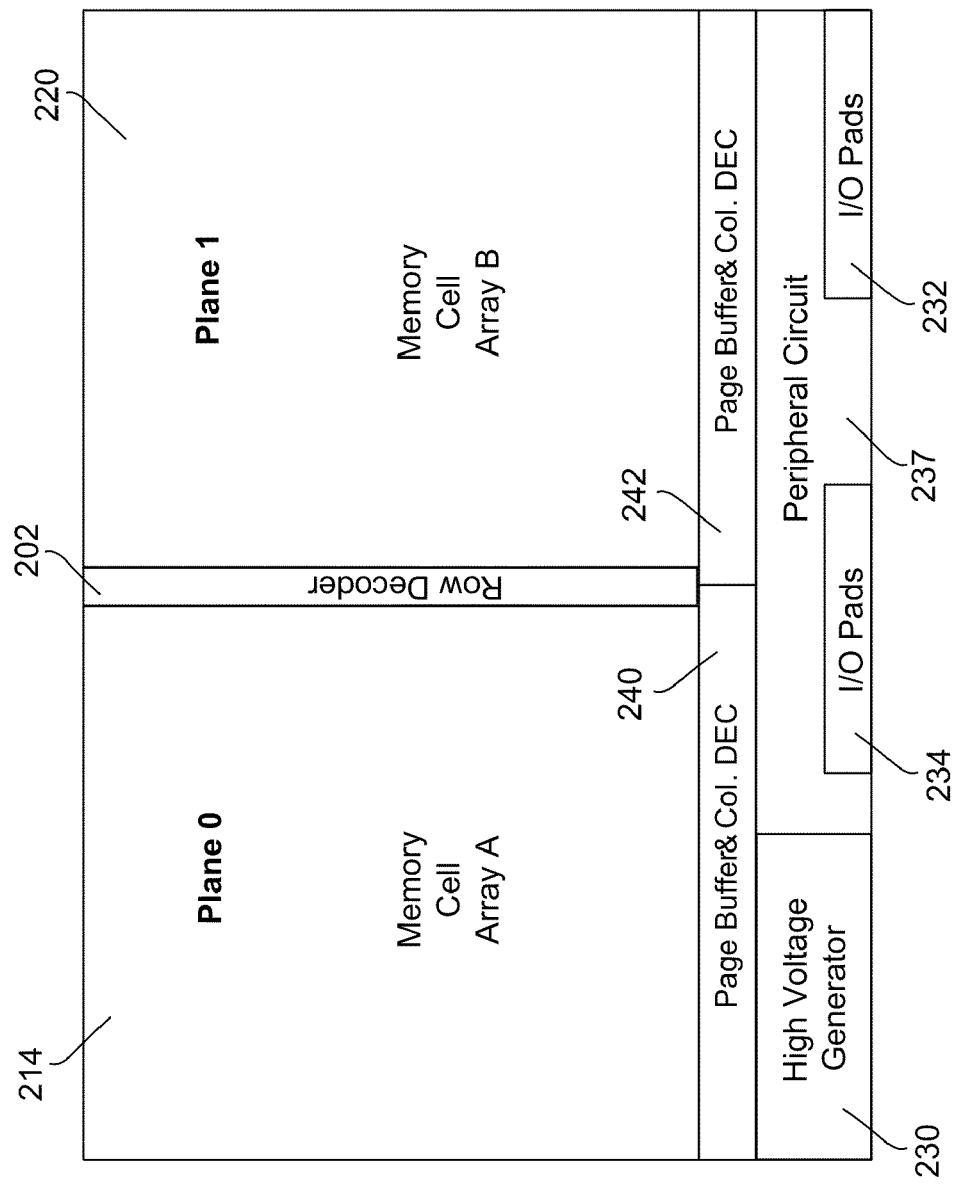
FIG. 2 is a block diagram of another example NAND flash chip floor plan.

Those skilled in the art will appreciate that chip floor plans for non-volatile memories will vary, within working constraints and specifications, depending on the choice of the designer. For instance, FIG. 2 is a block diagram of another example NAND flash chip floor plan 200 different from the one shown in FIG. 1. In the floor plan 200, there is a row decoder area 202 extending between two relatively adjacent edges of the areas of planes 214 and 220. Comparing the floor plan 200 to the floor plan 100, one finds the following differences (non-exhaustive list): the row decoder area 202 extends down the center of the floor plan 200 rather than having two spaced-apart row decoder areas, there is only a single high voltage generator area 230, input/output pad areas 232 and 234 extend along a floor plan edge that is adjacent peripheral circuit area 237. As contrasted to some of the other areas, it is noted that additional circuit areas 240 and 242 for page buffers and column decoders are similarly located to the areas 140 and 142 shown in FIG. 1.

Figure 3:
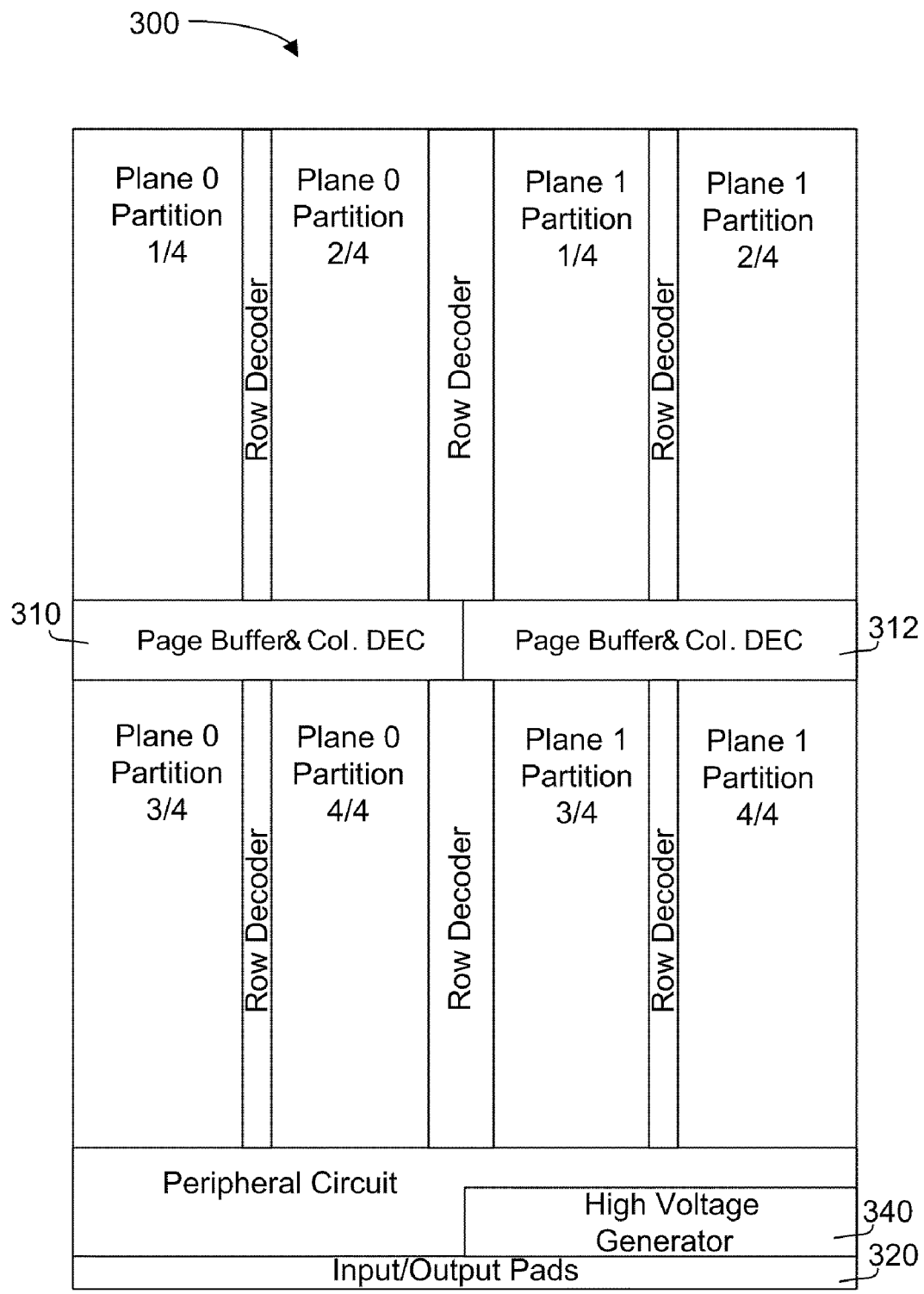
FIG. 3 is a block diagram of yet another example NAND flash chip floor plan.

FIG. 3 is a block diagram of yet another example NAND flash chip floor plan 300 different from the others shown and described previously. In the floor plan 300, a first circuit area 310 for page buffers and column decoders is located midway between areas of a first plane (Plane 0). A second circuit area 312 also for page buffers and column decoders is located midway between areas of a second plane (Plane 1). Somewhat similar to the floor plan 200 shown in FIG. 2, there is provided an input/output pad area 320 that extends along a floor plan edge that is adjacent the peripheral circuit area, and also there is only a single high voltage generator area 340.

Further details regarding the floor plan 300 are provided in Zeng et al., "A 172 mm2 32 Gb MLC NAND Flash Memory in 34 nm CMOS", ISSCC 2009 Digest of Technical Papers, pp. 236-237.

Figure 4:
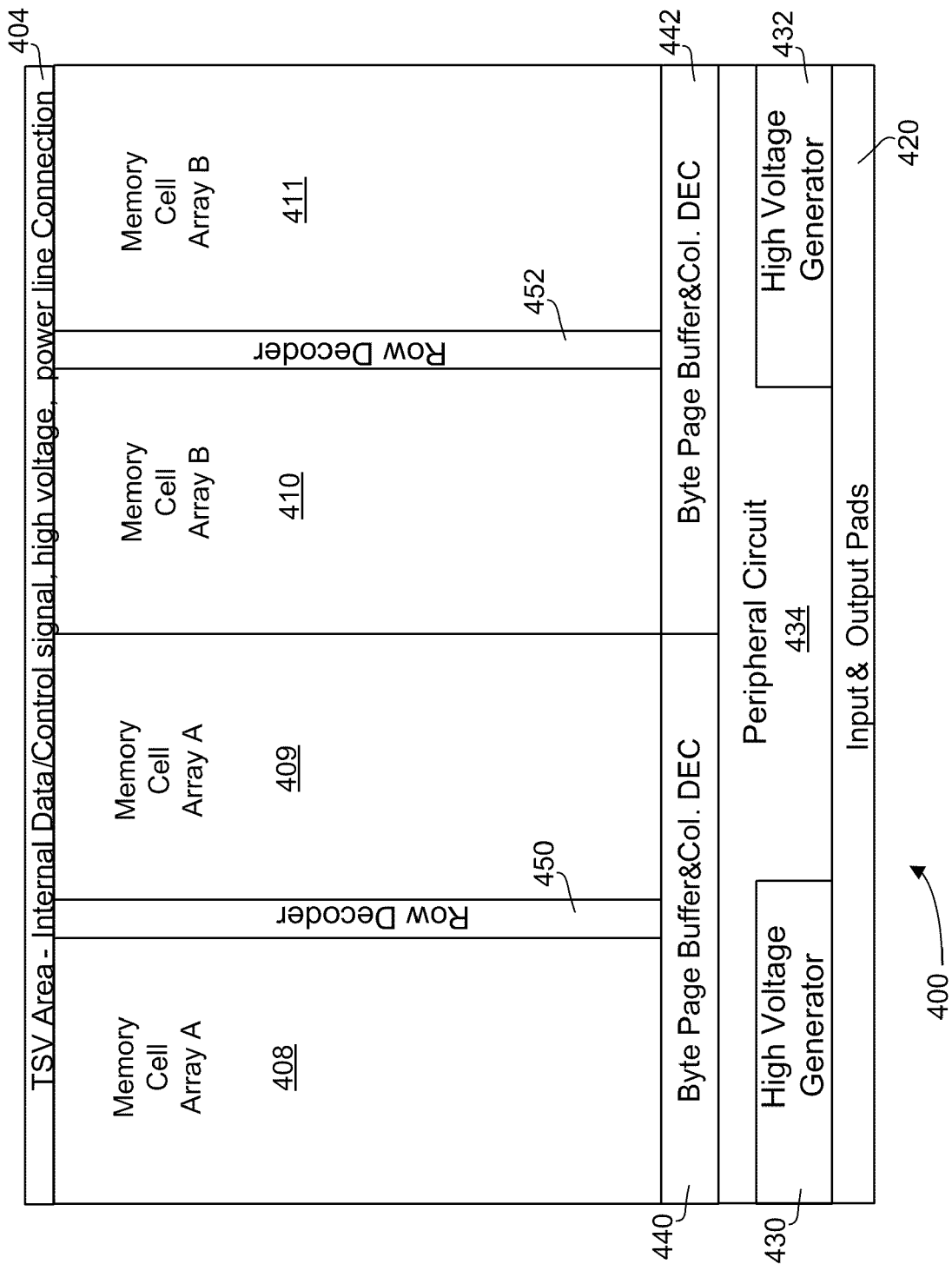
FIG. 4 is a block diagram of a NAND flash chip floor plan for a master memory device in accordance with an example embodiment.

In accordance with at least some example embodiments, flash memory devices are categorized as one of two possible types: a master flash chip and a slave flash chip. The floor plan of a master device may in many respects be similar to one of a conventional NAND flash memory, but with the inclusion of a TSV area. In this regard, FIG. 4 is a block diagram of a NAND flash chip floor plan 400 in accordance with an example embodiment.

In the illustrated floor plan 400, a Through-Silicon Vias (TSV) area 404 is located along a length-wise edge adjacent cell array area 408-411 (illustrated top of the chip, opposite side from input and output pads area 420). Also, areas 430, 432, 434, 440, 442, 450 and 452 are similar in layout to the areas 130, 132, 134, 140, 142, 110, 112 respectively that were described previously (floor plan 100 shown in FIG. 1). In accordance with at least some examples, the illustrated floor plan 400 corresponds to the floor plan of a master memory device of a system, as contrasted to a slave device.

In accordance with some example embodiments, a master device includes an address decoder, a pre-row decoder and a pre-column decoder for addressing slave devices. Differences between master and slave devices will become more clear from details subsequently provided in the present disclosure.

Figure 5:
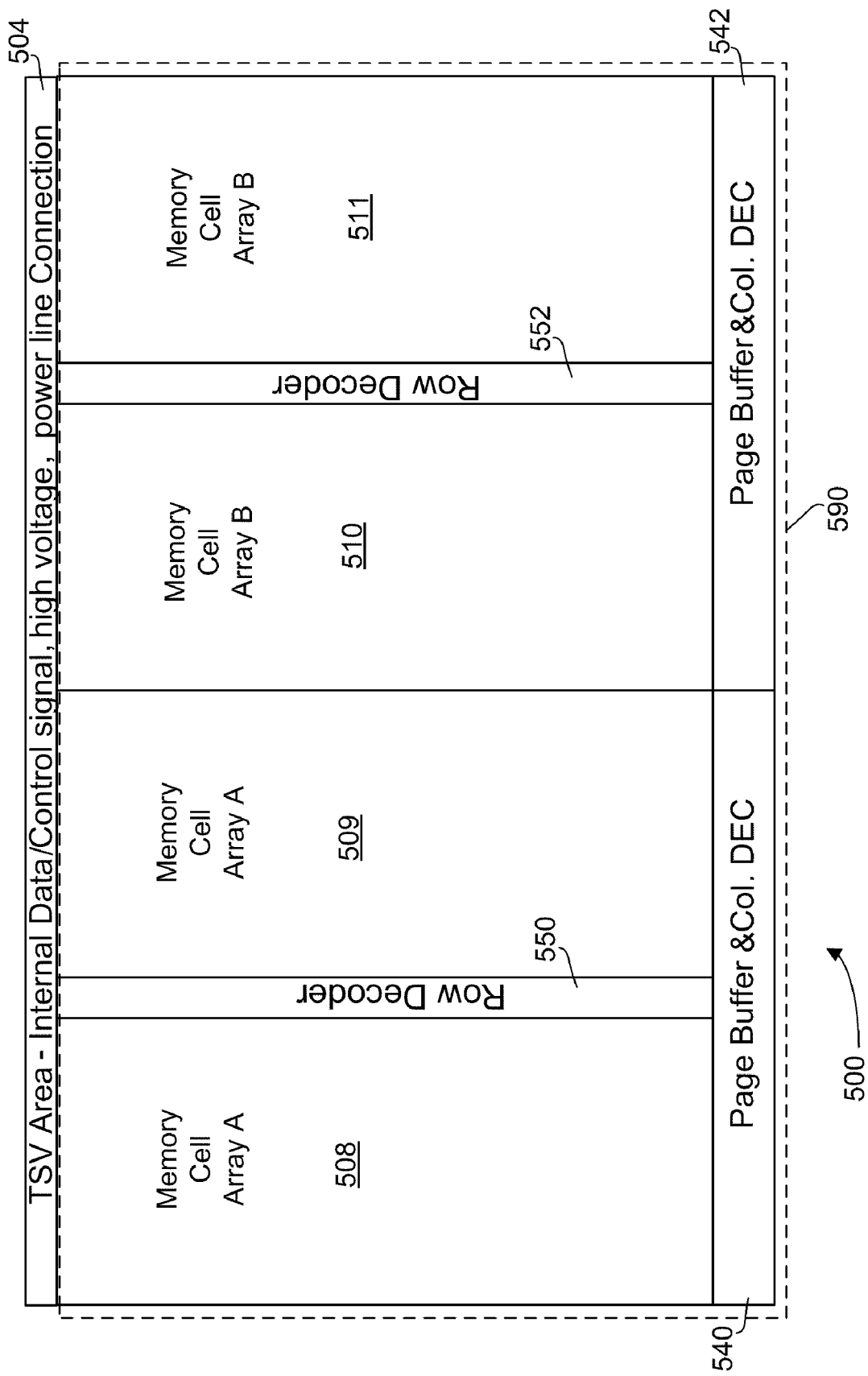
FIG. 5 is a block diagram of a NAND flash chip floor plan for a slave memory device in accordance with an example embodiment.

Reference will now be made to FIG. 5. FIG. 5 is a block diagram of a NAND flash chip floor plan 500 for a slave memory device in accordance with an example embodiment.

The device architecture of the illustrated example slave device includes a TSV area 504. Signal interface circuitries are located in the TSV area 504 and also the TSV area 404 (FIG. 4). Signal interface circuitries are, for example, circuitries that facilitate the transmitting and receiving of internal data and control signals, high voltage signals for read, program and erase operations, and Vcc and Vss power supply signals. Also, it will be apparent that TSV areas are so named because they are adapted to have TSVs extend through them, in order to provide electrical paths between chips in a stack.

Still with reference to FIG. 5, the other illustrated areas are NAND memory cell array areas 508-511, page buffer and column decoder areas 540 and 542, and row decoder areas 550 and 552. These areas comprise core areas 590 for the NAND memory core. In some examples, the core areas 590 are characterized by smaller sized features as compared to features within the TSV area 504 (for example, the process technology is more miniaturized).

Figure 6:
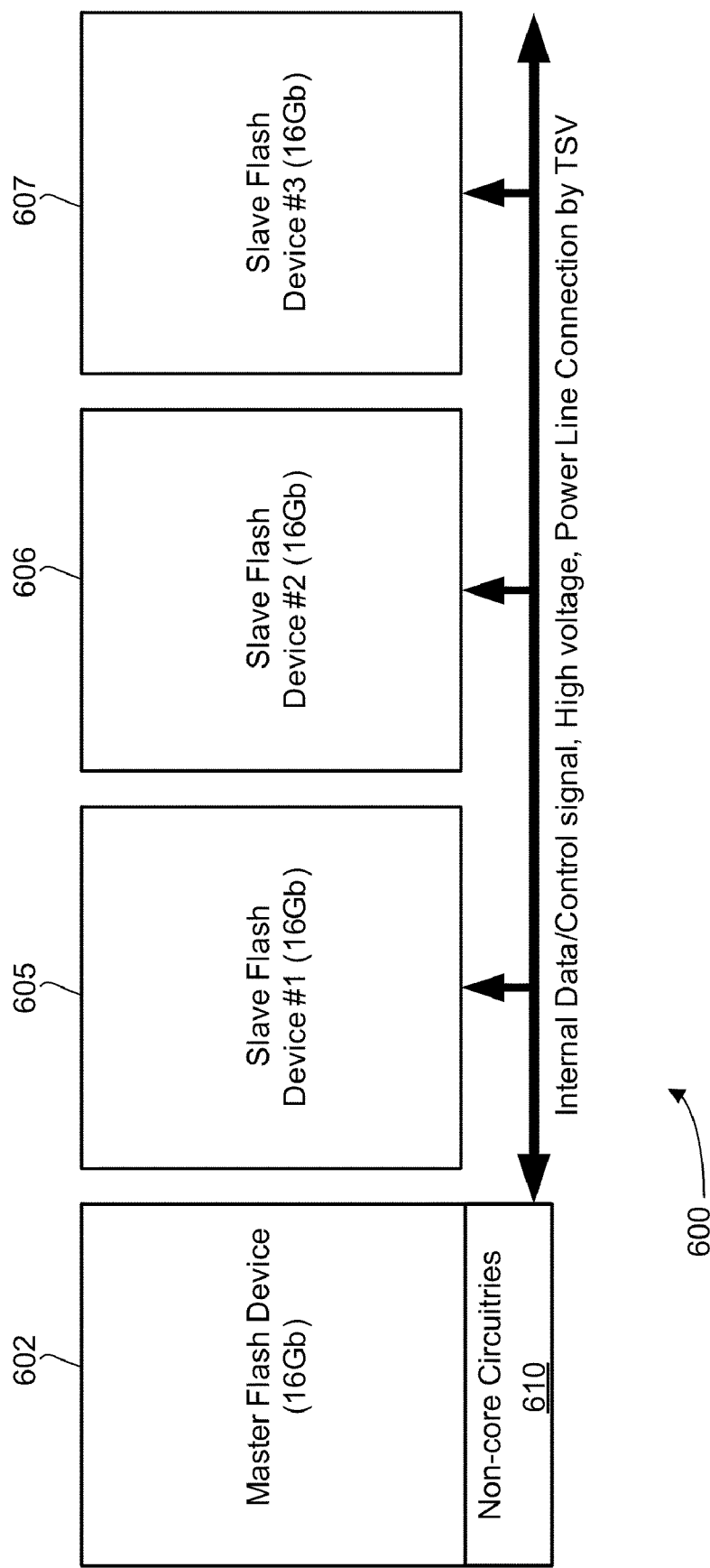
FIG. 6 is a block diagram showing a master memory device and three slave memory devices in accordance with an example embodiment.

FIG. 6 is a block diagram showing a four device, 64 Gb flash memory 600 in accordance with an example embodiment, and the 64 Gb flash memory 600 having one 16 Gb master device 602 and three 16 Gb slave devices 605-607. From the block diagram, it will be seen that the master device 602 includes a block 610 representative of areas for the input and output pads, peripheral circuitries and the high voltage generators; however similar areas are lacking within the slave devices 605-607 translating into very significant chip size reduction.

With respect to the above-described quad die stacked example embodiment, there is one 16 Gb master device and three 16 Gb slave devices (i.e. total 64 Gb memory capacity for all four devices). The master device 602 addresses 64 Gb memory space total, 16 Gb in the master device 602 and 48 Gb in the slave devices 605-607. Of course it will be understood that in some alternative example embodiments more than four dies will be stacked, and in other alternative example embodiments fewer than four devices may be stacked. Furthermore, example embodiments are in no way limited by memory capacities of the devices, and all suitable memory capacities are contemplated.

Figure 7:
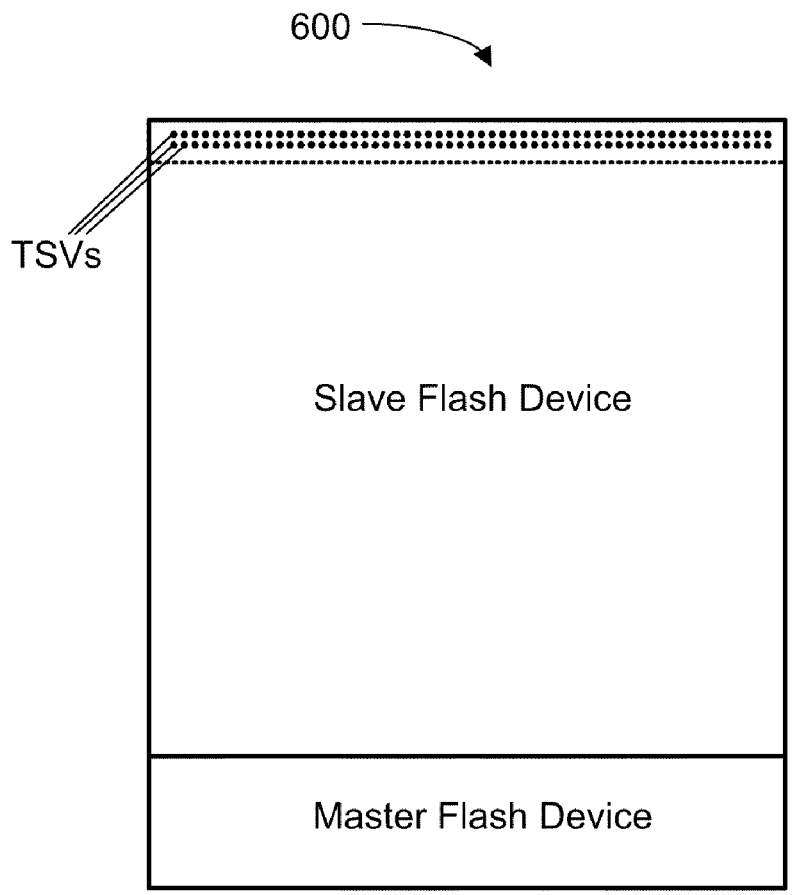
FIG. 7 shows, in diagrammatic form, a top view of one example of a stack consistent with the flash memory example embodiment shown in FIG. 6.
Figure 8:
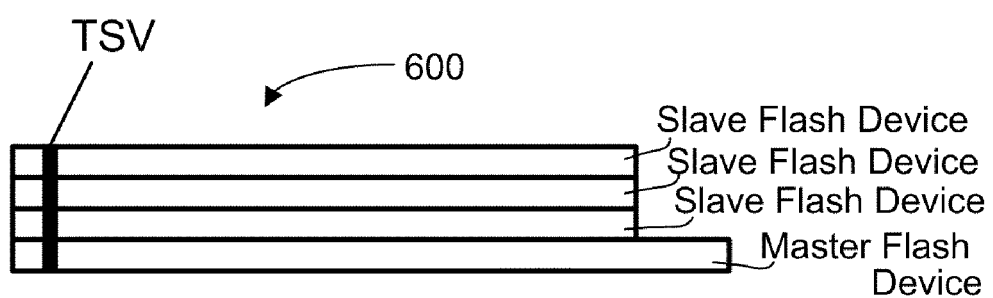
FIG. 8 shows, in diagrammatic form, a cross sectional view of the example stack shown in FIG. 7.

FIG. 7 and FIG. 8 diagrammatically depict the top view and cross sectional view respectively of the 64 Gb flash memory 600 described in connection with FIG. 6. The master device and three slave devices are connected with TSVs. The number of TSVs could be any number (for example, several tens, hundred or thousands) that one skilled in the art would understand to be suitable for the given stack of master and slave chips. In the illustrated example of FIG. 8, four flash devices are stacked, but stacking of any two or more non-volatile memory devices is contemplated.

Figure 9:
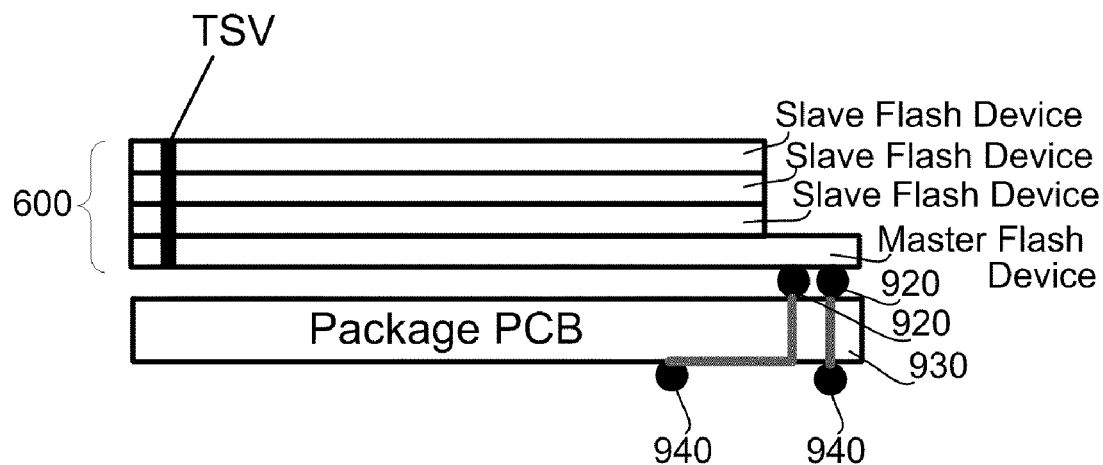
FIG. 9 shows, in diagrammatic form, a cross sectional view similar to a the cross sectional view of the example of FIG. 8, but additionally illustrating details of how an apparatus comprising the stacked devices may further include a package in which flip chip and bumping technology is employed.

FIG. 9 diagrammatically depicts a cross sectional view similar to FIG. 8, but additionally illustrating details of how the flash memory 600 may be in a package in which flip chip and bumping technology is employed. In the illustrated example, bumping balls 920 are located between the master flash chip and a package Printed Circuit Board (PCB) 930. Beneath and in connection with the package PCB 930 are package balls 940. Although for simplicity and convenience of illustration only two paths that each extend from the master flash chip, through a bumping ball, through the package PCB and through a package ball are shown, it will understood that many such paths will normally be present. Flip chip and bumping technology is well known to those skilled in the art, and background details regarding this technology may be obtained from a web page entitled "Flip-Chip Assembly" (currently publicly accessible at URL http://www.siliconfareast.com/flipchipassy.htm).

Figure 10:
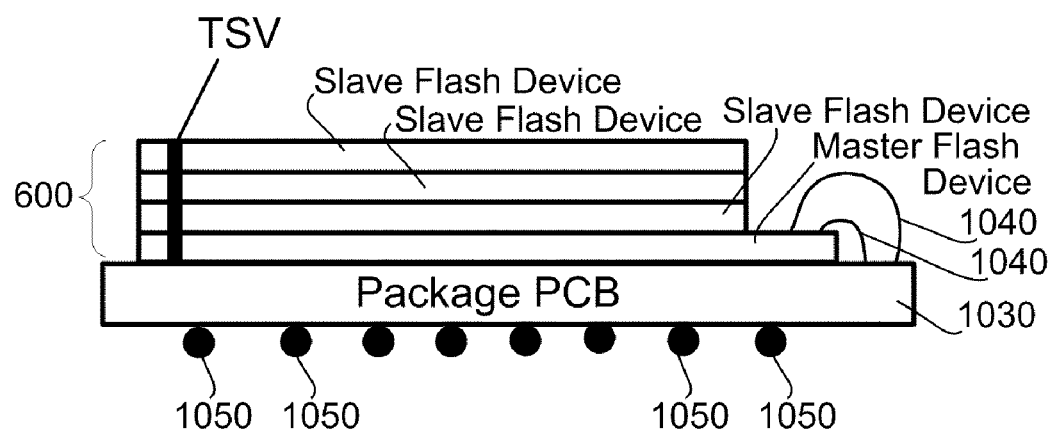
FIG. 10 shows, in diagrammatic form, a cross sectional view similar to a the cross sectional view of the example of FIG. 8, but additionally illustrating details of how an apparatus comprising the stack (i.e. stacked devices) may further include a conventional Ball Grid Array (BGA) package adapted for wire bonding technology.

Reference will now be made to FIG. 10 which illustrates an alternative example in which wire bonding is employed between a package PCB 1030 and the master flash device. Although not shown in FIG. 10, electrical paths formed by wires 1040 extending between the master flash chip and the package PCB 1030 also extend through the package PCB 1030 and package balls 1050. Furthermore, as BGA package technology is a very well known technology which has been the subject of many extensive writings, it will be understood that further specific implementation details need not be herein provided, as they should be readily apparent to one skilled in the art.

Figure 11:
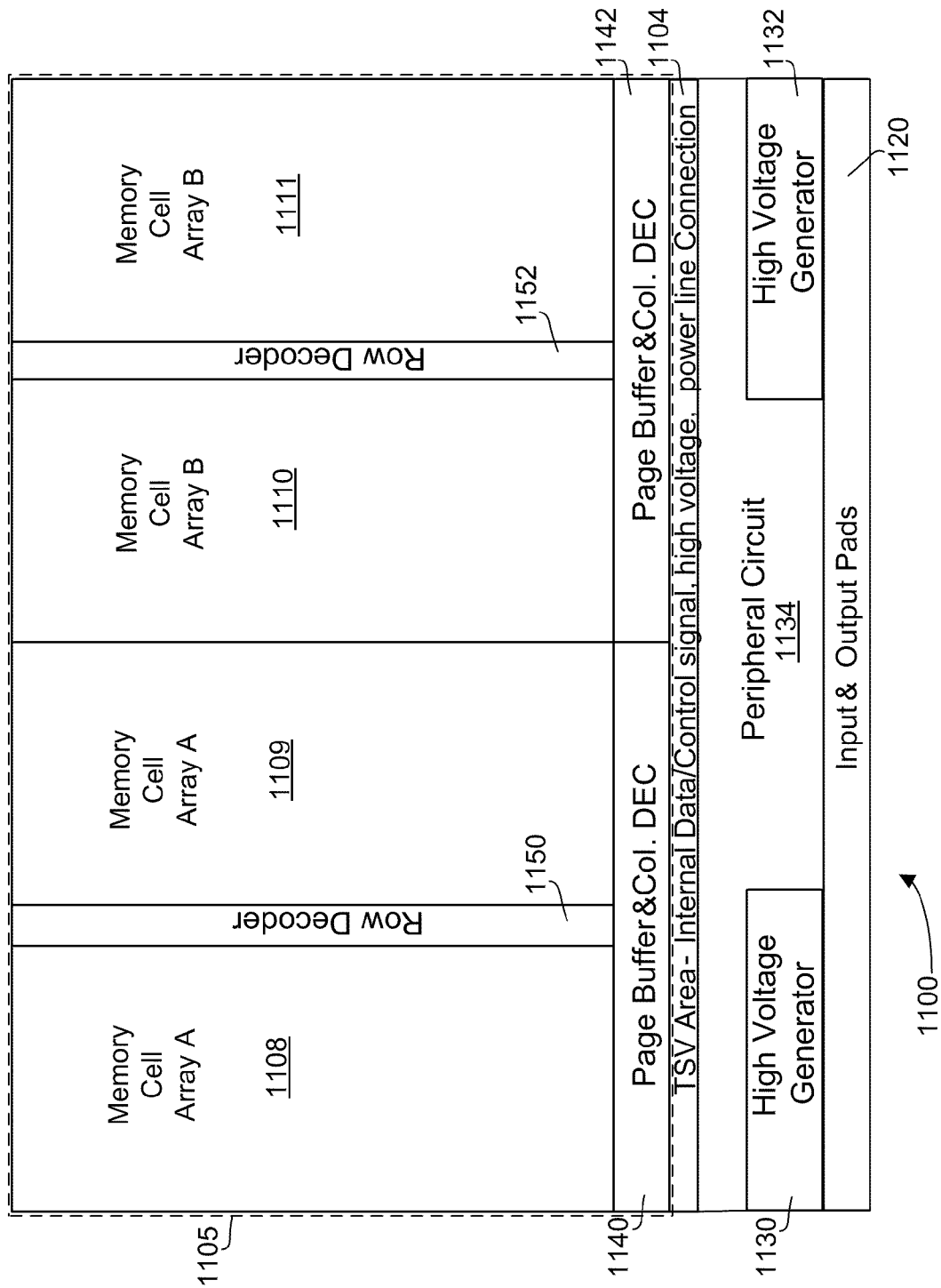
FIG. 11 is a block diagram of a NAND flash chip floor plan for a master memory device in accordance with an alternative example embodiment.

FIG. 11 is a block diagram of a NAND flash chip floor plan 1100 in accordance with an alternative example embodiment. In the illustrated floor plan 1100, a TSV area 1104 is located between memory core areas 1105 and a peripheral circuit area 1134. Also, it will be understood that areas 1108-1111, 1120, 1130, 1132, 1134, 1140, 1142, 1150 and 1152 shown in FIG. 11 are similar to the areas 408-411, 420, 430, 432, 434, 440, 442, 450 and 452 respectively that were shown in the previously described floor plan 400 of FIG. 4. Thus, the primary difference between the floor plan 1100 and floor plan 400 of FIG. 4 is the placement of the TSV area within the chip floor plan. In accordance with at least some examples, the illustrated floor plan 1100 corresponds to the floor plan of a master memory device of a system, as contrasted to a slave device. Additionally, the core areas 1105 are, in some examples, characterized by smaller sized features as compared to features within the remaining (non-core) areas. In this regard, the process technology may, for instance, be more miniaturized.

Figure 12:
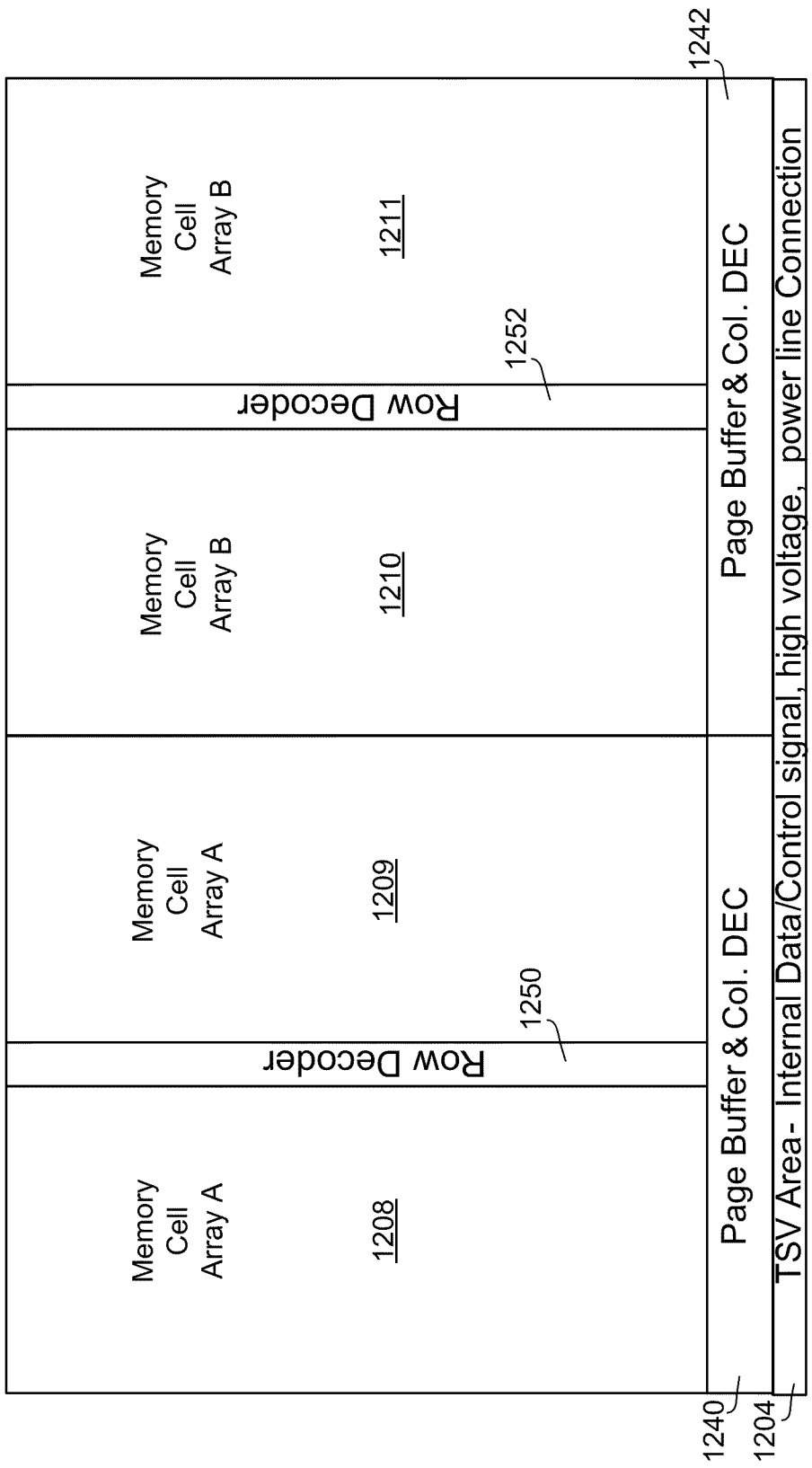
FIG. 12 is a block diagram of a NAND flash chip floor plan for a slave memory device in accordance with an alternative example embodiment.

Reference will now be made to FIG. 12. FIG. 12 is a block diagram of a NAND flash chip floor plan 1200 for a slave memory device in accordance with an alternative example embodiment. The device architecture of the illustrated example slave device includes a TSV area 1204 along a length-wise edge of the floor plan 1200 and adjacent page buffer and column decoder areas 1240 and 1242. Also, it will be understood that areas 1208-1211, 1240, 1242, 1250 and 1252 shown in FIG. 12 are similar to the areas 508-511, 540, 542, 550 and 552 respectively that were shown in the previously described floor plan 500 of FIG. 5. Thus, the primary difference between the floor plan 1200 and floor plan 500 of FIG. 5 is the placement of the TSV area within the chip floor plan.

Thus from a comparison of FIGS. 11 and 12 with FIGS. 4 and 5, it will be seen that the placement of the TSV area within a chip floor plan will vary (any suitable location is contemplated). For instance, in another alternative example embodiment the TSV area extends along a width-wise edge (instead of length-wise edge) of the chip floor plan. Also, it will be understood that the TSV area may extend along only a portion of (as opposed to entirely along) the length or width of the chip floor plan. In yet another alternative example embodiment, the TSV area is not proximate any of the chip floor plan edges, and could be, for example, centrally positioned between two opposing edges of the chip floor plan. In yet another alternative example embodiment, the TSV area is at least substantially interposed between two core areas of the chip floor plan. Also, in some example embodiments there may be a plurality of TSV areas within one chip floor plan. Thus, it is contemplated that the TSV area or areas may be positioned anywhere within the chip floor plan that one skilled in the art would understand to be suitable.

It will be understood that master and slave devices in accordance with various alternative example embodiments (including those example embodiments illustrated in FIGS. 11 and 12) may be stacked and packaged in a manner similar to the examples of FIGS. 7-10 previously shown and described.

Figure 13:
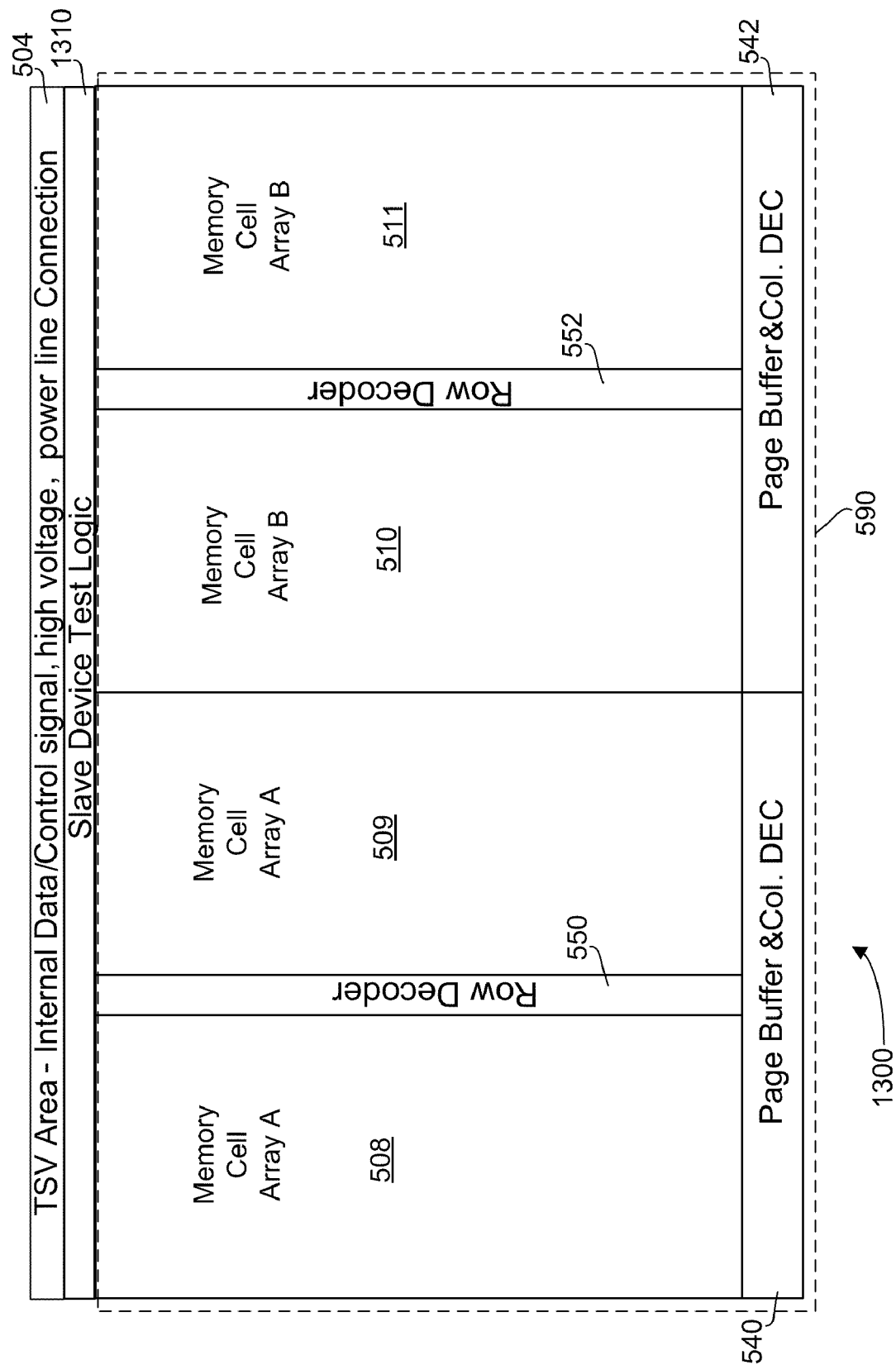
FIG. 13 is a block diagram of a NAND flash chip floor plan for a slave memory device in accordance with another alternative example embodiment.

In some example embodiments, the slave memory device may optionally include slave device test logic for facilitating the enhancement of the assembly yield. In this regard, reference is made to FIG. 13. The illustrated block diagram is similar to the block diagram of FIG. 5, but floor plan 1300 includes an additional area 1310 for slave device test logic that is configured to be driven by the master device during testing. The illustrated area 1310 is adjacent the TSV area 504; however placement of the area for slave device test logic in a variety of suitable alternative locations within any given chip floor plan is contemplated.

Having described master and slave chips, it will be apparent that the master and slave chips should be suitably compatible with each other so that non-core circuitries in the master chip are able to provide functionality for shared benefit of both the master and slave chips.

It will be understood that some example embodiments can be applied to any suitable non-volatile memory integrated circuit system, including those that might be characterized as, for example, NAND Flash, EEPROM, NOR Flash, EEPROM, AND Flash EEPROM, DiNOR Flash EEPROM, Serial Flash EEPROM, ROM, EPROM, FRAM, MRAM and PCRAM.

It will be understood that when an element is herein referred to as being "connected" or "coupled" to another element, it can be directly connected or coupled to the other element or intervening elements may be present. In contrast, when an element is herein referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", "extend through" versus "extend entirely through", etc.).

Certain adaptations and modifications of the described embodiments can be made. Therefore, the above discussed embodiments are considered to be illustrative and not restrictive.

What is claimed is:

1. A system comprising:
   a stack including:
      a first non-volatile memory chip; and
      a second non-volatile memory chip, the second non-volatile memory chip lacking in at least some non-core circuitries to facilitate chip size reduction; and
   a plurality of electrical paths extending between the first non-volatile memory chip and the second non-volatile memory chip, the electrical paths facilitating the first non-volatile memory chip in providing the second non-volatile memory chip with signals and voltages needed for device operations.

2. The system as claimed in claim 1 further comprising at least one additional non-volatile memory chip, the first non-volatile memory chip being a master device, and the second and additional memory chips being slave devices.

3. The system as claimed in claim 1 wherein the electrical paths comprise Through-Silicon Vias.

4. The system as claimed in claim 3 further comprising a package printed circuit board, the stack connected to the package printed circuit board by flip chip and bumping.

5. The system as claimed in claim 1 wherein only the first non-volatile memory chip includes a high voltage generator.

6. The system as claimed in claim 1 wherein the voltages include high voltages for program and erase operations.

7. The system as claimed in claim 1 wherein the second non-volatile memory chip includes slave device test logic that is configured to be driven by the first non-volatile memory chip during testing.

8. The system as claimed in claim 1 wherein the first non-volatile memory chip and the second non-volatile memory chip are NAND flash memory chips.

9. The system as claimed in claim 1 wherein the first non-volatile memory chip is a master device, and the second non-volatile memory chip is a slave device.

10. The system as claimed in claim 9 wherein the electrical paths comprise Through-Silicon Vias.

11. The system as claimed in claim 10 further comprising a package printed circuit board, the stack connected to the package printed circuit board by flip chip and bumping.

12. The system as claimed in claim 11 wherein the master memory device is substantially larger dimensioned that the slave memory device, and the master memory device is positioned substantially adjacent the package printed circuit board.

13. A method comprising manufacturing first and second non-volatile memory chips that are compatible with each other, the first and second non-volatile memory chips having substantially similar core chip areas, but only the first non-volatile memory chip having a number of additional chip areas within which are located circuitries providing functionality for shared of benefit of both the first and second non-volatile memory chips, and the circuitries of the additional chip areas configured to generate signals and voltages needed for device operations in relation to both the first and second non-volatile memory chips.

14. The method as claimed in claim 13 wherein the core chip areas have a more miniaturized process technology as compared to the additional chip areas.

15. The method as claimed in claim 14 wherein the additional chip areas include a peripheral circuit area, an input and output pads area, and at least one high voltage generator area.

16. The method as claimed in claim 13 wherein the first and second non-volatile memory chips are NAND flash memory chips.

17. The method as claimed in claim 13 wherein the manufacturing includes the manufacture of at least one additional non-volatile memory chip, the first non-volatile memory chip being a master device, and the second and additional memory chips being slave devices.

18. The method as claimed in claim 13 wherein the second non-volatile memory chip includes slave device test logic that is configured to be driven by the first non-volatile memory chip during testing.

19. The method as claimed in claim 13 wherein only the first non-volatile memory chip includes a high voltage generator.

20. Apparatus comprising first and second non-volatile memory chips that are compatible with each other, the first and second non-volatile memory chips having substantially similar core chip areas, but only the first non-volatile memory chip having a number of additional chip areas within which are located circuitries providing functionality for shared of benefit of both the first and second non-volatile memory chips, and the circuitries of the additional chip areas configured to generate signals and voltages needed for device operations in relation to both the first and second non-volatile memory chips.

21. The apparatus as claimed in claim 20 wherein the core chip areas have a more miniaturized process technology as compared to the additional chip areas.

22. The apparatus as claimed in claim 21 wherein the additional chip areas include a peripheral circuit area, an input and output pads area, and at least one high voltage generator area.

23. The apparatus as claimed in claim 20 wherein the first and second non-volatile memory chips are NAND flash memory chips.

24. The apparatus as claimed in claim 20 further comprising at least one additional non-volatile memory chip, the first non-volatile memory chip being a master device, and the second and additional memory chips being slave devices.

25. The apparatus as claimed in claim 20 wherein the second non-volatile memory chip includes slave device test logic that is configured to be driven by the first non-volatile memory chip during testing.

26. The apparatus as claimed in claim 20 wherein only the first non-volatile memory chip includes a high voltage generator.

* * * * *